US011029373B2

(12) United States Patent
Latham et al.

(10) Patent No.: US 11,029,373 B2
(45) Date of Patent: Jun. 8, 2021

(54) MAGNETIC FIELD SENSORS HAVING A MAGNETIC ANTI-ALIASING FILTER

(71) Applicant: Allegro MicroSystems, LLC, Manchester, NH (US)

(72) Inventors: Alexander Latham, Harvard, MA (US); Evan Shorman, Hooksett, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 156 days.

(21) Appl. No.: 16/512,680

(22) Filed: Jul. 16, 2019

(65) Prior Publication Data
US 2021/0018576 A1  Jan. 21, 2021

(51) Int. Cl.
*G01R 33/07* (2006.01)
*G01R 33/00* (2006.01)
*H05K 9/00* (2006.01)

(52) U.S. Cl.
CPC .......... *G01R 33/07* (2013.01); *G01R 33/007* (2013.01); *H05K 9/0075* (2013.01)

(58) Field of Classification Search
CPC .. G01R 33/07; G01R 33/007; G01R 33/0076; G01R 33/0029; G01R 15/20; H05K 9/0075; G01P 13/00
USPC ...................................................... 324/260
See application file for complete search history.

(56) References Cited

U.S. PATENT DOCUMENTS

| | | | | |
|---|---|---|---|---|
| 4,340,770 A | * | 7/1982 | Bridges | H05K 9/0075 148/108 |
| 4,559,495 A | * | 12/1985 | Lienhard | G01R 15/207 324/117 R |
| 5,041,780 A | * | 8/1991 | Rippel | G01R 15/207 324/117 H |
| 6,614,211 B1 | * | 9/2003 | Douglas | G01R 15/20 324/529 |
| 6,759,841 B2 | * | 7/2004 | Goto | G01R 15/202 324/117 H |
| 7,598,601 B2 | | 10/2009 | Taylor et al. | |
| 8,629,539 B2 | | 1/2014 | Milano et al. | |

(Continued)

OTHER PUBLICATIONS

Allegro MicroSystems, LLC; Datasheet A1363; Low Noise, High Precision, Programmable Linear Hall Effect Sensor IC With Advanced Temperature Compensation and High Bandwidth (120 kHz) Analog Output; 2019; 32 Pages.

*Primary Examiner* — Christopher P McAndrew
(74) *Attorney, Agent, or Firm* — Daly, Crowley, Mofford & Durkee, LLP

(57) ABSTRACT

A magnetic field sensor includes a substrate, a first channel comprising a first magnetic field sensing element supported by the substrate and configured to generate a first magnetic field signal indicative of a first magnetic field experienced by the first magnetic field sensing element, a second channel comprising a second magnetic field sensing element supported by the substrate and configured to generate a second magnetic field signal indicative of a second magnetic field experienced by the second magnetic field sensing element, and at least one shield configured to reduce a bandwidth of the first magnetic field by a first amount and to reduce a bandwidth of the second magnetic field by a second amount. The shield is able to act as a magnetic anti-aliasing filter for the magnetic field sensing elements, which can then be chopped or sampled.

47 Claims, 7 Drawing Sheets

(56) References Cited

U.S. PATENT DOCUMENTS

| | | | |
|---|---|---|---|
| 8,729,885 B2* | 5/2014 | Ausserlechner | G01R 33/0047 |
| | | | 324/117 H |
| 9,190,606 B2* | 11/2015 | Liu | H01L 43/14 |
| 9,245,547 B1* | 1/2016 | Latham | G11B 5/3903 |
| 9,958,482 B1* | 5/2018 | Latham | G01R 15/205 |
| 10,069,063 B2 | 9/2018 | Doogue et al. | |
| 10,156,614 B2 | 12/2018 | Latham et al. | |
| 10,352,969 B2 | 7/2019 | Milano et al. | |
| 2003/0001559 A1* | 1/2003 | Goto | G01R 15/202 |
| | | | 324/117 H |
| 2007/0076332 A1* | 4/2007 | Shoji | H01F 10/3281 |
| | | | 360/324.12 |
| 2007/0090825 A1* | 4/2007 | Shoji | G01R 15/205 |
| | | | 324/117 R |
| 2008/0013298 A1 | 1/2008 | Sharma et al. | |
| 2008/0094055 A1* | 4/2008 | Monreal | G01R 33/02 |
| | | | 324/117 H |
| 2011/0221429 A1* | 9/2011 | Tamura | G01R 15/207 |
| | | | 324/244 |
| 2017/0115362 A1* | 4/2017 | Latham | G01R 33/0023 |
| 2018/0149713 A1* | 5/2018 | Latham | G01R 15/202 |
| 2018/0224508 A1* | 8/2018 | Kelly | A61B 5/062 |
| 2019/0170785 A1* | 6/2019 | Riccardi | G01S 11/16 |

* cited by examiner

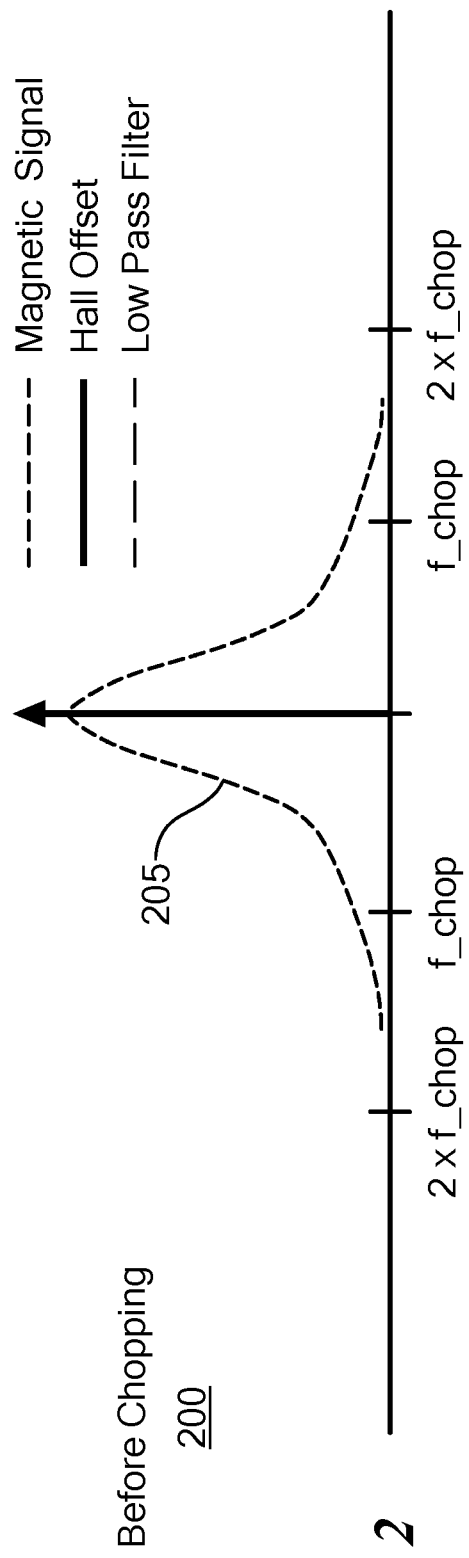
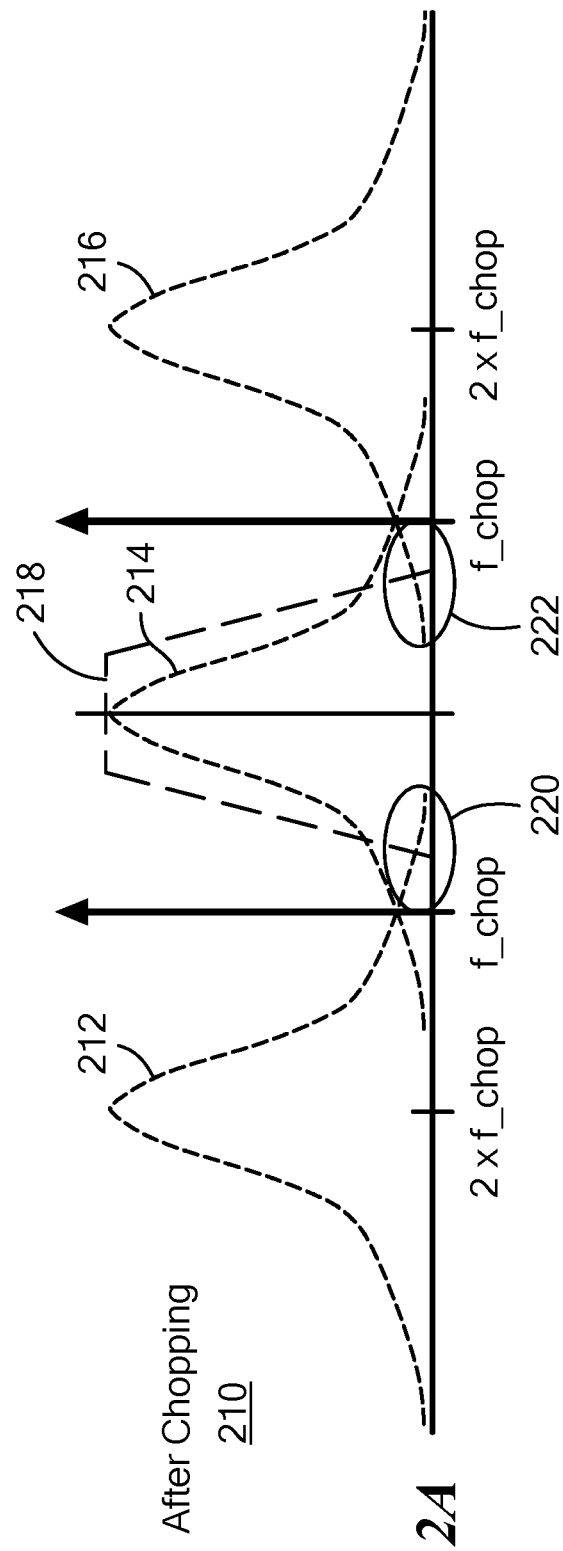
FIG. 2
FIG. 2A

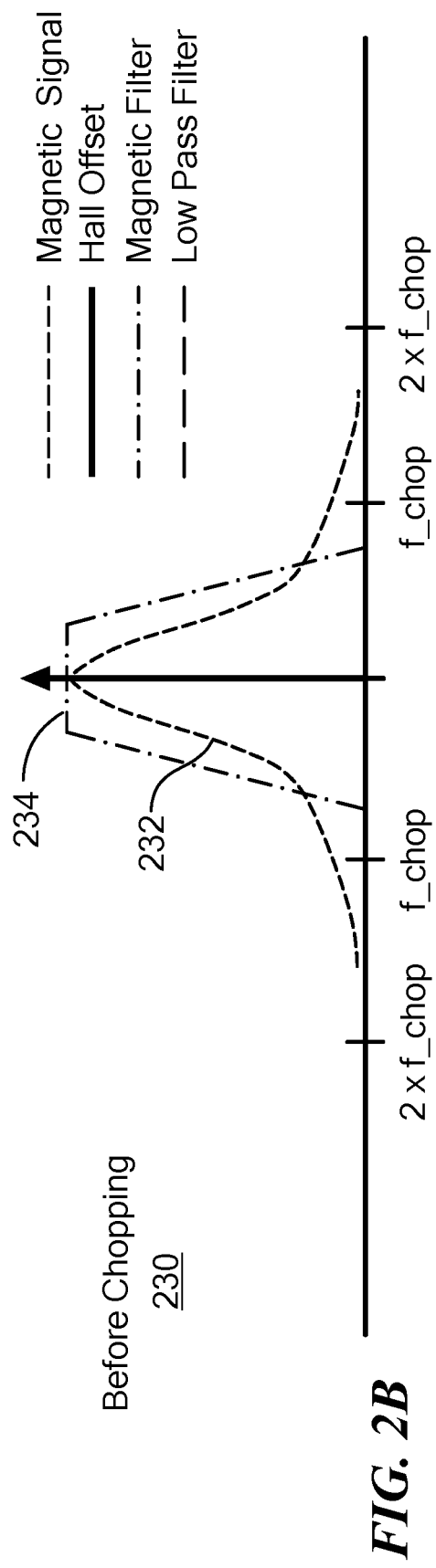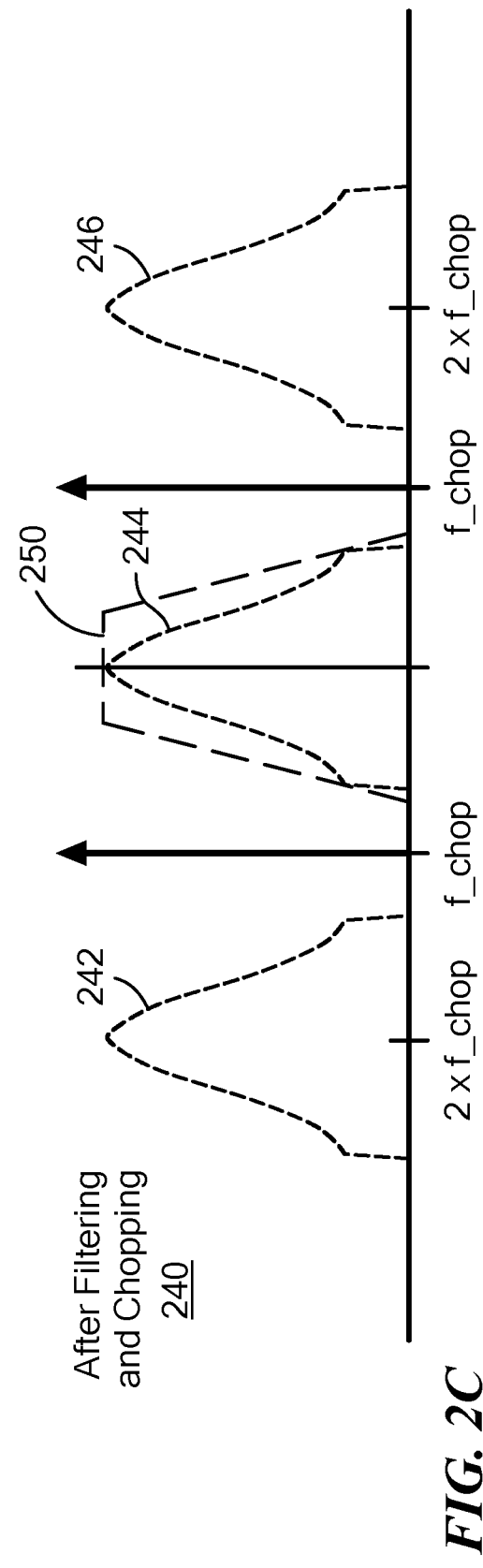
FIG. 2B
FIG. 2C

MAGNETIC FIELD SENSORS HAVING A MAGNETIC ANTI-ALIASING FILTER

CROSS-REFERENCE TO RELATED APPLICATIONS

Not Applicable.

STATEMENT REGARDING FEDERALLY SPONSORED RESEARCH

Not Applicable.

FIELD

This disclosure relates generally to magnetic field sensors and more particularly, to sensors having anti-aliasing filtering.

BACKGROUND

As is known, sensors are used in various types of devices to measure and monitor properties of systems in a wide variety of applications. For example, sensors have become common in products that rely on electronics in their operation, such as automotive and motor control systems.

Some sensors utilize sampling techniques including but not limited to chopping of the sensing element to reduce offset and/or conversion from analog signals to digital signals. Such sampled systems can experience aliasing whereby the content of the magnetic field signal to be sensed cannot be accurately recovered. While conventional filtering circuitry techniques can be applied to reduce or eliminate aliasing, such filtering does not always work with chopping and/or can require large amounts of sensor die area.

SUMMARY

According to the disclosure, a magnetic field sensor includes a substrate, a first channel including a first magnetic field sensing element supported by the substrate and configured to generate a first magnetic field signal indicative of a first magnetic field experienced by the first magnetic field sensing element, a second channel including a second magnetic field sensing element supported by the substrate and configured to generate a second magnetic field signal indicative of a second magnetic field experienced by the second magnetic field sensing element, and at least one shield configured to reduce a bandwidth of the first magnetic field by a first amount and to reduce a bandwidth of the second magnetic field by a second amount.

Features of the disclosure may include one or more of the following, alone or in combination. In embodiments, the second amount by which the at least one shield reduces the bandwidth of the second magnetic field is approximately zero. The first channel can further include a switching circuit coupled to receive the first magnetic field signal and configured to generate a sampled signal. The at least one shield is configured to reduce aliasing of the sampled signal. The switching circuit can include a chopping circuit configured to chop the first magnetic field sensing element. The switching circuit can include an analog-to-digital converter configured to convert the first magnetic field signal into a digital signal. The first channel is further configured to generate a first sensor output signal based on the first magnetic field signal and the second channel is further configured to generate a second sensor output signal based on the second magnetic field signal. The magnetic field sensor can further include a processor coupled to receive the first magnetic field signal and the second magnetic field signal and configured to generate a combined sensor output signal based on the first magnetic field signal and the second magnetic field signal. The magnetic field sensor can include a first signal path configured to carry a low frequency signal, extracted from the second magnetic field signal, from the second channel to the first channel, and a second path configured to carry an offset-compensated signal from the first channel to the second channel to compensate for an offset associated with the second magnetic field signal. The magnetic field sensor can be a current sensor. The magnetic field sensor can be a linear sensor. The sensor can include a lead frame supporting the substrate, wherein the at least one shield is a die attach pad of the lead frame that is disposed under the first magnetic field sensing element and is not disposed under the second magnetic field sensing element. The at least one shield can include a conductive layer disposed over the first magnetic field sensing element and not disposed over the second magnetic field sensing element. The at least one shield can be a solid or patterned conductive layer.

Also described is a method including generating a first magnetic field signal indicative of a first magnetic field experienced by a first magnetic field sensing element, the first magnetic field sensing element supported by a substrate, generating a second magnetic field signal indicative of a second magnetic field experienced by a second magnetic field sensing element, the second magnetic field sensing element supported by the substrate, reducing a bandwidth of the first magnetic field by a first amount using at least one shield, and reducing a bandwidth of the second magnetic field by a second amount using the at least one shield.

Features of the disclosure may include one or more of the following, alone or in combination. The second amount by which the at least one shield reduces the bandwidth of the second magnetic field signal is approximately zero. The method can further include generating a sampled signal from the first magnetic field signal and reducing aliasing of the sampled signal. The method can further include chopping the first magnetic field sensing element.

Also described is a magnetic field sensor including means for generating a first magnetic field signal indicative of a first magnetic field experienced by a first magnetic field sensing element, the first magnetic field sensing element supported by a substrate, means for generating a second magnetic field signal indicative of a second magnetic field experienced by a second magnetic field sensing element, the second magnetic field sensing element supported by the substrate, means for reducing a bandwidth of the first magnetic field by a first amount, and means for reducing a bandwidth of the second magnetic field by a second amount.

Features of the disclosure may include one or more of the following, alone or in combination. The sensor can further include means for generating a sampled signal from the first magnetic field signal and means for reducing aliasing of the sampled signal. The sensor can further include means for chopping the first magnetic field signal.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

FIG. 2 shows a frequency spectral density of a magnetic field signal before chopping, without any magnetic filter techniques of the present disclosure;

FIG. 2A shows a frequency spectral density of a magnetic field signal after chopping, with a conventional low pass filter applied as represented by the frequency response;

FIG. 2B shows example frequency spectral densities of an example magnetic field signal and magnetic field filter before chopping;

FIG. 2C shows example frequency spectral densities of an example magnetic field signal after magnetic filtering and chopping, according to the present disclosure;

DETAILED DESCRIPTION

Figure 1:
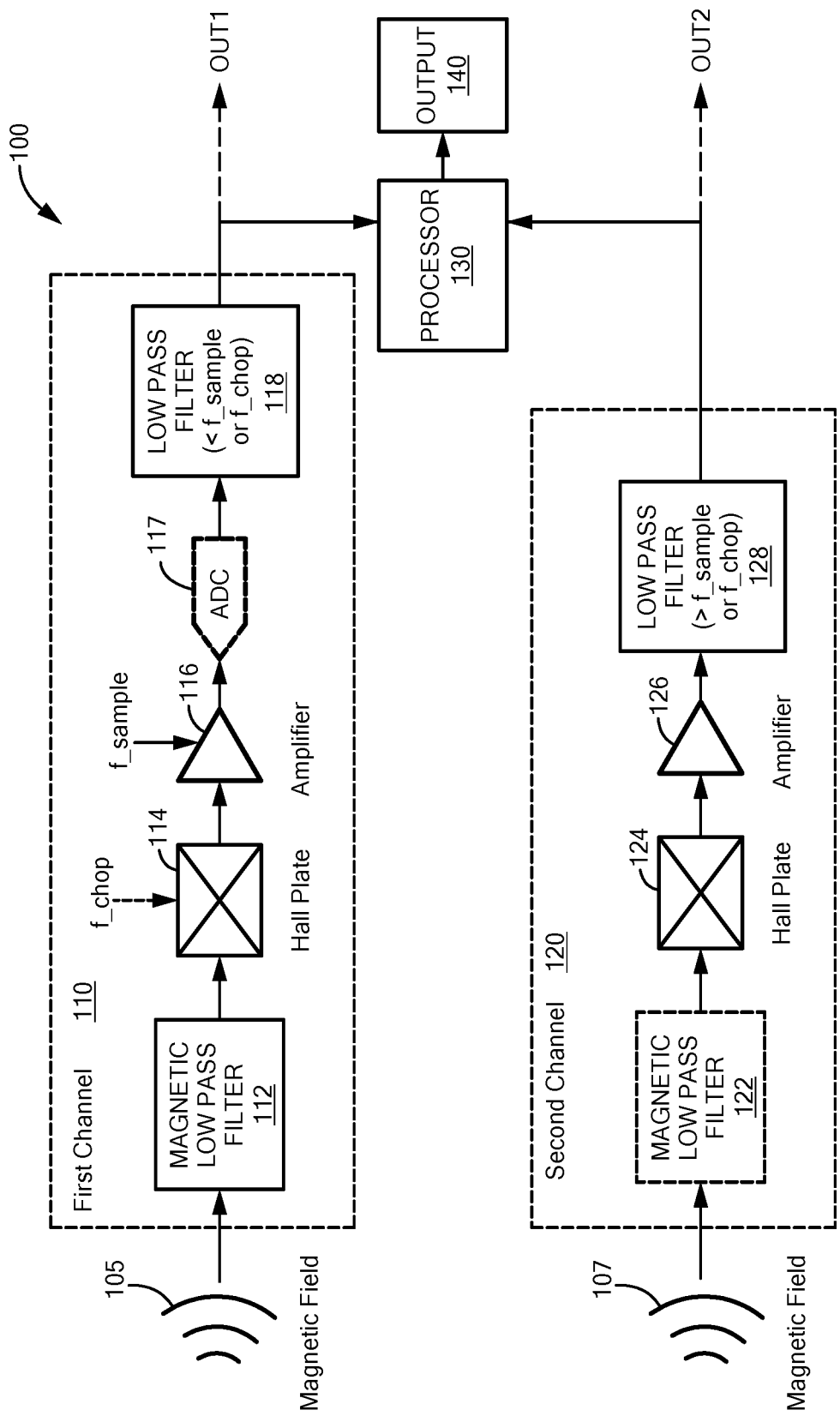
FIG. 1 is a block diagram showing a magnetic field sensor including two channels and a shield configured to reduce the bandwidth of a first magnetic field generated by the first channel by a first amount and a second magnetic field generated by the second channel by a second amount.

Before describing the present invention, some introductory concepts and terminology are explained. Magnetic field sensors are used in a variety of applications, including, but not limited to an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field. As used herein, the term "magnetic field sensor" or simply "sensor" is used to describe a circuit that uses one or more magnetic field sensing elements, generally in combination with other circuits. The magnetic field sensor can be, for example, a rotation detector, a movement detector, a current sensor, or a proximity detector. As used herein, the term "rotation detector" is used to describe a circuit that includes at least one "magnetic field sensing element" which detects a magnetic field. The rotation detector can sense movement, e.g., rotation, of a ferromagnetic object, for example, advance and retreat of magnetic domains of a ring magnet or advance and retreat of gear teeth of a ferromagnetic gear. Similarly, the term "movement detector" can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear.

Ferromagnetic objects described herein can have a variety of forms, including, but not limited to a ring magnet having one or more pole pair or a gear having two or more gear teeth. Ferromagnetic gears are used in some examples below to show a rotating ferromagnetic object having ferromagnetic features, i.e., teeth. However, in other embodiments, the gear can be replaced with a ring magnet having at least one pole pair. Also, linear arrangements of ferromagnetic objects that move linearly are possible.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Referring to FIG. 1, a magnetic field sensor 100 as may take the form of a linear sensor or a current sensor can be used, for example, to detect a magnetic field 105 proximate the sensor. The magnetic field 105 can be a magnetic field generated by a moving object such as a ferromagnetic object or a magnetic field generated by flowing current. The magnetic field sensor 100 includes a first channel 110 and a second channel 120, each including a respective magnetic field sensing element 114, 124 configured to generate a magnetic field signal indicative of a magnetic field experienced by the respective magnetic field sensing element. The magnetic field sensor 100 includes a processor 130 configured to receive and process the magnetic field signals generated by each channel, according to the present disclosure and to provide an appropriate output 140.

It will be appreciated that a "channel" refers generally to processing circuitry associated with one or more magnetic field sensing elements and configured to generate a respective channel signal. While the particular processing circuitry shown in FIG. 1 to provide the first channel 110 includes a magnetic field sensing element 114 and an amplifier 116 (and similarly the second channel 120 includes a magnetic field sensing element 124 and an amplifier 126), such channels can include less, more, or different processing circuitry.

A shield (e.g., magnetic low pass filters 112, 122) provides magnetic filtering that can reduce or eliminate aliasing for chopped or sampled magnetic field sensing elements. The shield can take the form of metal layers, sheets, or other structures configured and positioned to limit the bandwidth of the magnetic field which can pass through the shield, with the bandwidth being determined by factors including the thickness of the shield as well as the shape of the shield near the magnetic field sensing element.

Figure 1A:
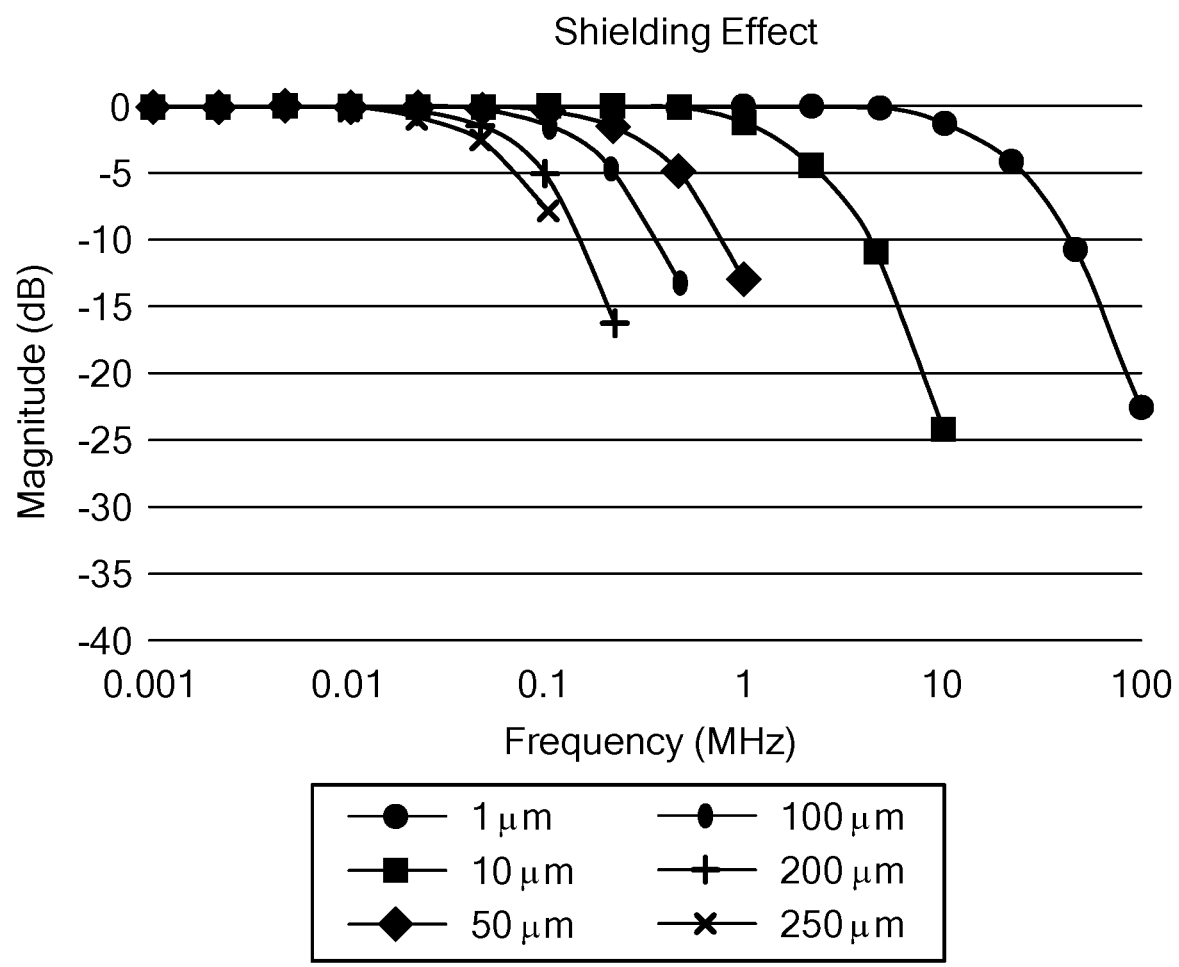
FIG. 1A is a graph showing the frequency response of an example magnetic field sensing element (a Hall element in this example) positioned below metal sheets of differing thicknesses.

FIG. 1A shows the frequency response of an example magnetic field sensing element (a Hall element in this example) positioned below metal sheets of differing thicknesses. In order to reduce or eliminate aliasing in a sampled system, the bandwidth of the magnetic field allowed to pass through to the magnetic field sensing element can be less than half the sample rate of the magnetic field sensing element in order to avoid aliasing.

The first channel 110 includes a magnetic low pass filter 112, created using a shield that reduces a bandwidth of a first magnetic field 105 experienced by the first magnetic field sensing element 114. The magnetic field sensing element 114 may be a Hall plate or other magnetic field sensing element. The first channel 110 includes an amplifier 116 to amplify the magnetic field signal output by the magnetic field sensing element 114. The first channel 110 may also include an analog-to-digital converter (ADC) 117 for converting the processed magnetic field signal into a digital signal. The first channel 110 can also include a low pass filter 118 for filtering the signal as needed. The output of the first channel 110 can be provided to a processor 130 as the first sensor output signal based on the first magnetic field signal, and/or can be provided as a direct output OUT1 (i.e., sent off-chip).

The second channel 120 can include a magnetic low pass filter 122 which effectively forms a shield that can reduce a bandwidth of a second magnetic field 107 experienced by the second magnetic field sensing element 124. The magnetic fields 105, 107 experienced by the sensing elements 114, 124, respectively, can be generated by the same source or by different sources. The magnetic low pass filter 122 can reduce the bandwidth of the second magnetic field 107 experienced by the second magnetic field sensing element 124 by a second amount, different than the first amount by which the magnetic low pass filter 112 reduces the bandwidth of the first magnetic field 105 experienced by the first magnetic field sensing element 114, which second amount may be greater than or less than the first amount. In embodiments, the filter 122 may be omitted such that the second magnetic field 107 experienced by the second magnetic field sensing element 124 is not affected. In embodiments, the magnetic filter 122 can be configured so that the first magnetic field 105 experienced by the first magnetic field sensing element 114 and the second magnetic field 107 experienced by the second magnetic field sensing element 124 is substantially the same at lower bandwidths and, as the frequency increases, the field magnitude seen by each sensing element will change due to the filters 112, 122.

The magnetic field sensing element 124 may be any appropriate magnetic field sensing element, such as a Hall plate for example. The second channel 120 includes an amplifier 126 to amplify the magnetic field signal output by the magnetic field sensing element 124. The second channel 120 can include a low pass filter 128 for filtering the processed magnetic field signal as needed. The output of the second channel 120 is provided to the processor 130 as a second sensor output signal based on the second magnetic field signal, and/or can be provided as a direct output OUT2 (i.e., sent off-chip). As an alternative, or in addition to providing output signals OUT1, OUT2 as separate sensor output signals, processor 130 and/or output module 140 can combine the lower bandwidth signal OUT1 with the higher bandwidth signal OUT2 to provide a combined sensor output signal in various formats.

The sensor 100 can include a switching circuit coupled to receive the first magnetic field signal and configured to generate a sampled signal. The switching circuit can be a chopping circuit (e.g., magnetic field sensing element 114 chopped at f sample or f chop) configured to chop the first magnetic field sensing element 114. The switching circuit can be an analog-to-digital converter (e.g., ADC 117).

FIG. 2 shows a waveform 200 of an example frequency response 205 of a magnetic field signal before chopping, without any magnetic filter techniques of the present disclosure. FIG. 2A shows a waveform 210 of an example frequency response of a magnetic field signal including components 212, 214, 216 after chopping, with a conventional low pass filter applied (as represented by frequency response 218). Note that aliasing can result at 220, 222 where the value of the sensed magnetic field may not be able to be accurately recovered.

FIG. 2B shows a waveform 230 of an example frequency response 232 of a magnetic field signal before chopping and showing the magnetic filter response 234 according to the magnetic filtering techniques of the present disclosure. The portion of the magnetic field signal that is allowed to pass through by the magnetic filter is under the frequency response 234 of the filter.

FIG. 2C shows a waveform 240 of an example frequency response of a magnetic field signal including components 242, 244, 246 after magnetic filtering according to the magnetic filter techniques of the present disclosure and after chopping. After further low pass filtering by a filter with response 250, the magnetic signal can be recovered without aliasing. Thus, accuracy is improved by removing aliasing using the magnetic filtering techniques of the present disclosure. Here, the bandwidth of the resulting output signal is limited to be less than f chop.

Figure 3:
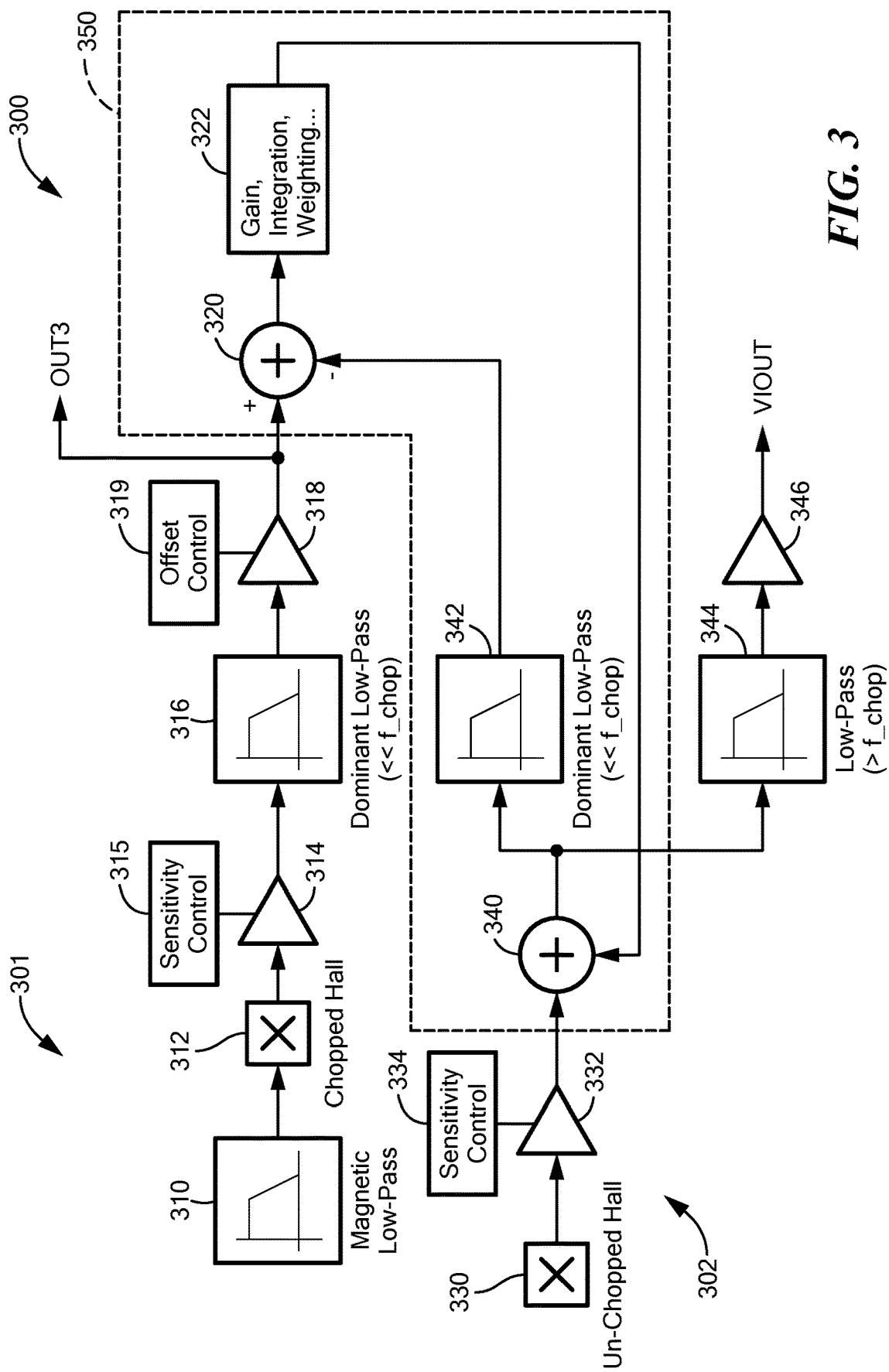
FIG. 3 is a block diagram showing the magnetic field sensor in greater detail with the low accuracy channel improved by removing the offset based on the high accuracy channel.

FIG. 3 is a block diagram showing an example magnetic field sensor 300 having a first channel 301, including magnetic field sensing element 312 (which may be the same as or similar to magnetic field sensing element 114 in FIG. 1) and a second channel 302 including a magnetic field sensing element 330 (which may be the same as or similar to magnetic field sensing element 124 in FIG. 1). FIG. 3 provides one example implementation for combining the signal generated by the first channel with the signal generated by the second channel.

In the sensor 300, the first channel 301 with sensing element 312 can be a higher accuracy, lower bandwidth channel, and the second channel 302 with sensing element 330 can be a lower accuracy, higher bandwidth channel. The first channel 301 includes magnetic low pass filter 310 (which may be the same as or similar to magnetic low pass filter 112), magnetic field sensing element 312 (which may be a chopped Hall sensing element), an amplifier 314 which may include sensitivity control 315, a dominant low-pass filter 316, and an amplifier 318 which may include offset control 319. The output of the amplifier 318 can be provided as a separate output OUT3 (which may be the same as output OUT1 in FIG. 1), and/or may for example be fed to a combiner 320, which is part of a processor 350 (which may be the same as or substantially similar to processor 130 in FIG. 1).

The second channel 302 includes magnetic field sensing element 330 (which may be an un-chopped Hall sensing element), an amplifier 332 which may have sensitivity control 334, a combiner 340 (responsive to a feedback signal from a gain, integration, and weighting block 322 as will be described). The second channel 302 also includes a low pass filter 344 and amplifier 346. The low pass filter 344 may be the same filter as the filter 128 in FIG. 1. The amplifier 346 may be the same as or substantially similar to the amplifier 140 in FIG. 1. The output VIOUT of the amplifier 346 can be the same as output 140 shown in FIG. 1.

A combiner 320, gain, integration, weighting block 322, combiner 340, and filter 342 can be part of the processor 350, which may be the same as or substantially similar to processor 130 in FIG. 1.

A magnetic low pass filter 310 filters a bandwidth of a magnetic field experienced by the magnetic field sensing element 312 by a first amount, and filters a bandwidth of a magnetic field experienced by the magnetic field sensing element 330 by a second amount which may be zero (in other words it does not filter the bandwidth of the second magnetic field sensing element), so that only the first magnetic field sensing element 312 is reduced by a first amount.

In this configuration, the first channel 301 provides a lower bandwidth, higher accuracy signal OUT3 from the chopped Hall plate 312, and the second channel 302 provides a higher bandwidth, lower accuracy signal from the un-chopped Hall plate 330.

With combiner 320, the low frequency content of the second channel 302 (as extracted by filter 342) can be compared with the high accuracy output signal OUT3 of the first channel 301. To this end, the low-pass filter 316 can be designed to have the same or similar cutoff as the low-pass filter 342. The difference provided by combiner 320 (as may be referred to as an error signal) can be processed by a loop stabilizing gain, integration, and weighting block 322 to generate a feedback signal for coupling to combiner 340. At combiner 340, the processed difference is combined with the un-chopped Hall signal in order to thereby correct this lower accuracy, higher bandwidth signal for offset (low frequency) errors. In this way, the high accuracy channel 301 is used to compensate or correct for offset in the low accuracy channel 302, so as to improve the accuracy of the output VIOUT while maintaining high bandwidth.

It will be appreciated that although shown and described with respect to two channels having a first, higher accuracy and lower bandwidth channel 301 and a second, lower accuracy and higher bandwidth channel 302, more than two channels, having more than two accuracies and bandwidths can be established by the circuitry, configurations and techniques described herein. As such, for example, three channels can be provided with a first, highest accuracy and lowest bandwidth channel, a second, medium accuracy and medium bandwidth channel, and a third lowest accuracy and highest bandwidth channel, according to the techniques of the present disclosure.

Figure 4:
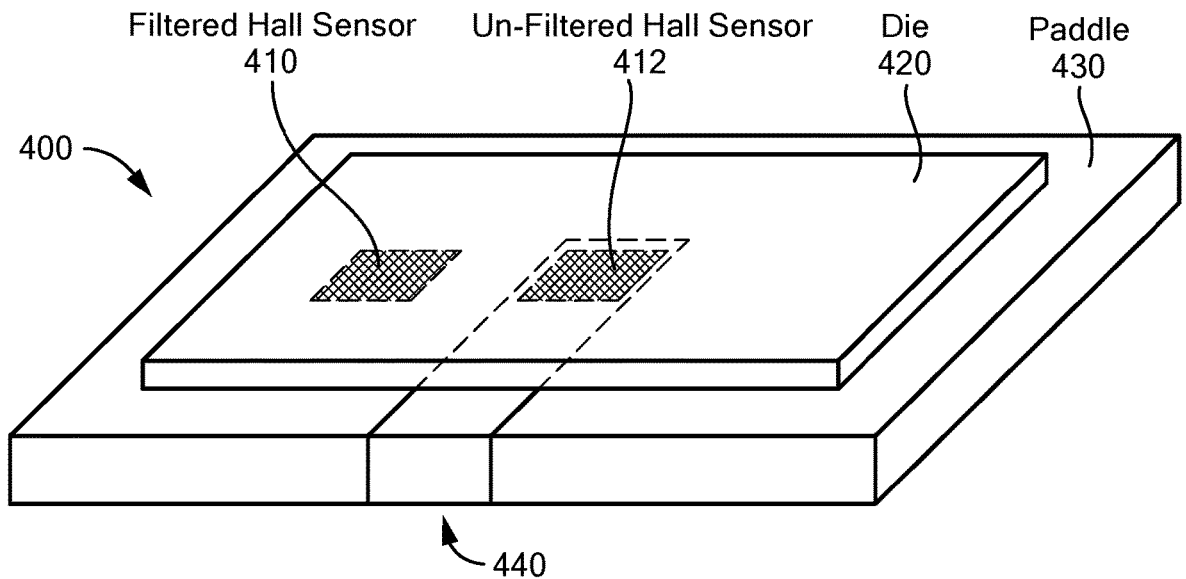
FIG. 4 is an example perspective view of a configuration of a magnetic field sensor having a paddle based shield covering at least one magnetic field sensing element.

FIG. 4 is an example perspective view of a magnetic field sensor 400 having a paddle 430 that acts as a shield, or magnetic filter for at least one magnetic field sensing element 410, with one element 412 unaffected by the shield. The paddle 430 or "die attach pad" can be part of a lead frame that supports a substrate (or "die") 420. The paddle 430 supports a die 420 having a first magnetic field sensing element 410 (which may be the same as or similar to sensing element 114) and a second magnetic field sensing element 412 (which may be the same as or similar to sensing element 124).

Sensor 400 can be a "die-up" configuration. By "die-up" it is meant that the sensor and/or magnetic field sensing element 410 is facing "upward" away from the lead frame. The paddle 430 is disposed under the magnetic field sensing element 410 and is not disposed under the second magnetic field sensing element 412. In this example, the paddle 430 itself acts as the shield to provide the magnetic shielding, or filtering of the sensing element 410, without shielding the magnetic field sensing element 412 due to the groove (or slot) 440 in the paddle 430. The slot 440 may be filled with an insulating, dielectric material, for example. The dimensions and type of material of the paddle 430 can be selected so that the first magnetic field sensing element 410 is shielded by a first amount (i.e., the bandwidth of the magnetic field experienced by element 410 is reduced by the first amount) and the second magnetic field sensing element 412 is shielded by a second amount (i.e., the bandwidth of the magnetic field experienced by the second element 412 is reduced by the second amount), or not shielded at all, in which case the second amount is zero. In some cases, dimensions and type of material of the paddle 430 and the slot 440 can be selected so that the first magnetic field sensing element 410 and the second magnetic field sensing element 412 experience a same shielding (and thus a same magnetic field) at lower magnetic field frequencies, and experience differing shielding at higher magnetic field frequencies. Thus, the first amount and the second amount can be the same at lower magnetic field frequencies and the first amount can differ from the second amount at higher frequencies.

Figure 5:
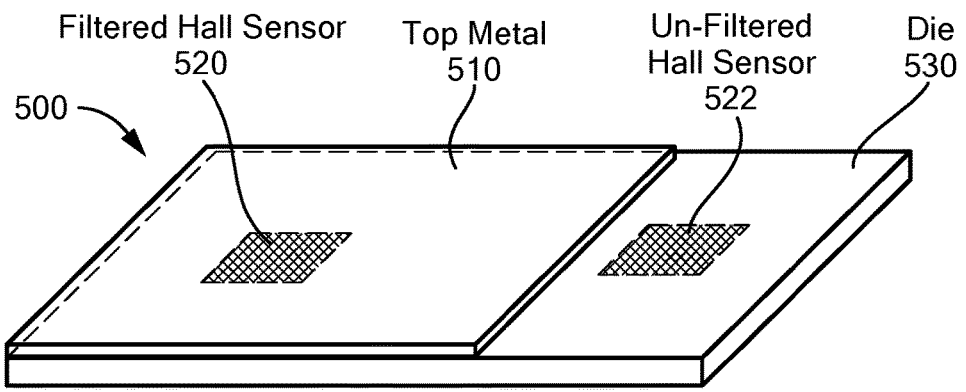
FIG. 5 is an example perspective view of a configuration of a magnetic field sensor having a on die metal based shield covering at least one magnetic field sensing element.

FIG. 5 is an example perspective view of an alternative magnetic field sensor 500 having a shield covering at least one magnetic field sensing element. The magnetic field sensor 500 includes a die 530 (e.g., substrate) having a first magnetic field sensing element 520 (which may be the same as or similar to magnetic field element 114) and a second magnetic field sensing element 522 (which may be the same as or similar to magnetic field element 124). A top metal shield layer 510 is disposed over the first magnetic field sensing element 520 but not over the second magnetic field sensing element 522 or otherwise can partially cover the elements to achieve the desired bandwidth. The shield 510 can be a solid or patterned conductive layer. The sensor 500 can be in a "flip chip" configuration. By "flip chip" it is meant that the sensor and/or magnetic field sensing elements are facing "downward" toward the lead-frame of the package.

In this example, the top metal shield layer 510 acts as the shield to provide shielding, or filtering of sensing element 520 without shielding magnetic field sensing element 522 due to the top metal layer 510 only extending over the magnetic field sensing element 520 and not over the magnetic field sensing element 522. The dimensions and type of material for the metal layer 510 can be selected so that the magnetic field sensing element 520 is shielded by a first amount (i.e., the bandwidth of the magnetic field experienced by element 520 is reduced by the first amount) and the magnetic field sensing element 522 is shielded by a second amount (i.e., the bandwidth of the magnetic field experienced by the second element 522 is reduced by the second amount), or not shielded at all, in which case the second amount is zero. In some cases, the dimensions and type of material for the metal layer 510 can be selected so that the magnetic field sensing element 520, 522 experience a same filtering (and thus a same magnetic field) at lower bandwidths, and then experience differing filtering amounts at higher bandwidths. Thus, the first amount and the second amount can be the same at lower frequencies and then the first amount can differ from the second amount at higher frequencies, so that they are two different shielding values or one shielding while the other is not.

It will be appreciated that some embodiments could combine the metal shield 510 together with the paddle 430 and/or slots 440 in the paddle to achieve the desired bandwidth control.

Figure 6:
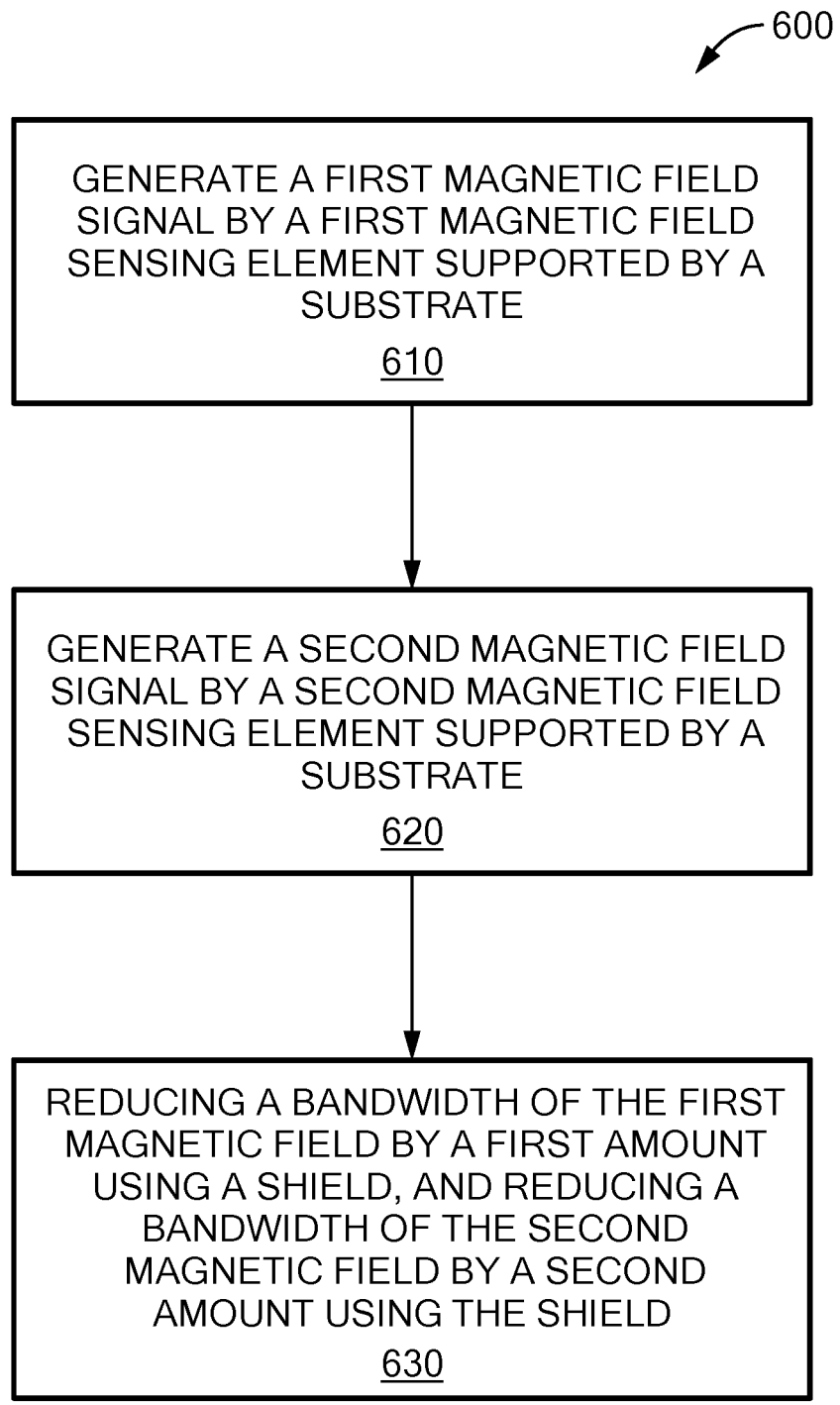
FIG. 6 is a flow chart of a process for magnetic filtering in a magnetic field sensor.

FIG. 6 is a flow chart of a process 600 for shielding, or filtering, a magnetic field according to the present disclosure. The process 600 starts at block 610 by generating a first magnetic field signal indicative of a first magnetic field experienced by a first magnetic field sensing element supported by a substrate. For example, first magnetic field sensing element 410 supported by substrate 420 shown in FIG. 4, or first magnetic field sensing element 520 supported by substrate 530 shown in FIG. 5 generates the first magnetic field signal.

At block 620, the process continues by generating a second magnetic field signal indicative of a second magnetic field experienced by a second magnetic field sensing element supported by the substrate. For example, the second magnetic field sensing element 412 supported by substrate 420 shown in FIG. 4, or second magnetic field sensing element 522 supported by substrate 530 shown in FIG. 5 generates the second magnetic field signal. It will be appreciated that the same substrate that supports the first magnetic field sensing element also supports the second magnetic field sensing element.

At block 630, the process continues by reducing a bandwidth of the first magnetic field by a first amount using a shield and reducing a bandwidth of the second magnetic field by a second amount using the shield. As described herein, the first amount and the second amount can be the same at lower frequencies and differ at higher frequencies or the first amount can be different from the second amount at all frequencies or the second amount can be zero.

All references cited herein are hereby incorporated herein by reference in their entirety. Having described preferred embodiments, it will now become apparent to one of ordinary skill in the art that other embodiments incorporating their concepts may be used. It is felt therefore that these embodiments should not be limited to disclosed embodiments, but rather should be limited only by the spirit and scope of the appended claims. The circuitry, structures, and techniques described herein are applicable to a variety of magnetic field sensors, including proximity or rotation sensors, current sensors, linear sensors, or any sensor where aliasing can occur and/or where both a low bandwidth, high accuracy channel and a high bandwidth, low accuracy channel are desired.

What is claimed is:

1. A magnetic field sensor comprising:
a substrate;
a first channel comprising a first magnetic field sensing element supported by the substrate and configured to generate a first magnetic field signal indicative of a first magnetic field experienced by the first magnetic field sensing element;
a second channel comprising a second magnetic field sensing element supported by the substrate and configured to generate a second magnetic field signal indicative of a second magnetic field experienced by the second magnetic field sensing element; and
at least one shield configured to reduce a bandwidth of the first magnetic field by a first amount and to reduce a bandwidth of the second magnetic field by a second amount, wherein the second amount by which the at least one shield reduces the bandwidth of the second magnetic field is approximately zero.

2. The magnetic field sensor of claim 1, wherein the first channel further comprises a switching circuit coupled to receive the first magnetic field signal and configured to generate a sampled signal.

3. The magnetic field sensor of claim 2, wherein the at least one shield is configured to reduce aliasing of the sampled signal.

4. The magnetic field sensor of claim 2, wherein the switching circuit comprises a chopping circuit configured to chop the first magnetic field sensing element.

5. The magnetic field sensor of claim 2, wherein the switching circuit comprises an analog-to-digital converter configured to convert the first magnetic field signal into a digital signal.

6. The magnetic field sensor of claim 1, wherein the first channel is further configured to generate a first sensor output signal based on the first magnetic field signal and the second channel is further configured to generate a second sensor output signal based on the second magnetic field signal.

7. The magnetic field sensor of claim 1, further comprising a processor coupled to receive the first magnetic field signal and the second magnetic field signal and configured to generate a combined sensor output signal based on the first magnetic field signal and the second magnetic field signal.

8. The magnetic field sensor of claim 7, further comprising:
a first signal path configured to carry a low frequency signal extracted from the second magnetic field signal from the second channel to the first channel; and a second path configured to carry an offset-compensated signal from the first channel to the second channel to compensate for an offset associated with the second magnetic field signal.

9. The magnetic field sensor of claim 1, wherein the magnetic field sensor comprises a current sensor.

10. The magnetic field sensor of claim 1, wherein the magnetic field sensor comprises a linear sensor.

11. The magnetic field sensor of claim 1, further comprising a lead frame supporting the substrate, wherein the at least one shield comprises a die attach pad of the lead frame that is disposed under the first magnetic field sensing element and is not disposed under the second magnetic field sensing element.

12. The magnetic field sensor of claim 1, wherein the at least one shield comprises a conductive layer disposed over the first magnetic field sensing element and not disposed over the second magnetic field sensing element.

13. The magnetic field sensor of claim 12, wherein the at least one shield is a solid or patterned conductive layer.

14. A method comprising:
generating a first magnetic field signal indicative of a first magnetic field experienced by a first magnetic field sensing element, the first magnetic field sensing element supported by a substrate;
generating a second magnetic field signal indicative of a second magnetic field experienced by a second magnetic field sensing element, the second magnetic field sensing element supported by the substrate;
reducing a bandwidth of the first magnetic field by a first amount using at least one shield; and
reducing a bandwidth of the second magnetic field by a second amount using the at least one shield, wherein the second amount by which the at least one shield reduces the bandwidth of the second magnetic field signal is approximately zero.

15. The method of claim 14, further comprising generating a sampled signal from the first magnetic field signal and reducing aliasing of the sampled signal.

16. The method of claim 14, further comprising chopping the first magnetic field sensing element.

17. A magnetic field sensor comprising:
a substrate;
a first channel comprising a first magnetic field sensing element supported by the substrate and configured to generate a first magnetic field signal indicative of a first magnetic field experienced by the first magnetic field sensing element, wherein the first channel further comprises a switching circuit coupled to receive the first magnetic field signal and configured to generate a sampled signal;
a second channel comprising a second magnetic field sensing element supported by the substrate and configured to generate a second magnetic field signal indicative of a second magnetic field experienced by the second magnetic field sensing element; and
at least one shield configured to reduce a bandwidth of the first magnetic field by a first amount and to reduce a bandwidth of the second magnetic field by a second amount, wherein the at least one shield is configured to reduce aliasing of the sampled signal.

18. The magnetic field sensor of claim 17, wherein the first channel is further configured to generate a first sensor output signal based on the first magnetic field signal and the second channel is further configured to generate a second sensor output signal based on the second magnetic field signal.

19. The magnetic field sensor of claim 17, further comprising a processor coupled to receive the first magnetic field signal and the second magnetic field signal and configured to generate a combined sensor output signal based on the first magnetic field signal and the second magnetic field signal.

20. The magnetic field sensor of claim 19, further comprising:
a first signal path configured to carry a low frequency signal extracted from the second magnetic field signal from the second channel to the first channel; and
a second path configured to carry an offset-compensated signal from the first channel to the second channel to compensate for an offset associated with the second magnetic field signal.

21. A magnetic field sensor comprising:
a substrate;
a first channel comprising a first magnetic field sensing element supported by the substrate and configured to generate a first magnetic field signal indicative of a first magnetic field experienced by the first magnetic field sensing element, wherein the first channel further comprises a switching circuit coupled to receive the first magnetic field signal and configured to generate a sampled signal, and wherein the switching circuit comprises a chopping circuit configured to chop the first magnetic field sensing element;
a second channel comprising a second magnetic field sensing element supported by the substrate and configured to generate a second magnetic field signal indicative of a second magnetic field experienced by the second magnetic field sensing element; and
at least one shield configured to reduce a bandwidth of the first magnetic field by a first amount and to reduce a bandwidth of the second magnetic field by a second amount.

22. The magnetic field sensor of claim 21, wherein the first channel is further configured to generate a first sensor output signal based on the first magnetic field signal and the second channel is further configured to generate a second sensor output signal based on the second magnetic field signal.

23. The magnetic field sensor of claim 21, further comprising a processor coupled to receive the first magnetic field signal and the second magnetic field signal and configured to generate a combined sensor output signal based on the first magnetic field signal and the second magnetic field signal.

24. The magnetic field sensor of claim 23, further comprising:
a first signal path configured to carry a low frequency signal extracted from the second magnetic field signal from the second channel to the first channel; and
a second path configured to carry an offset-compensated signal from the first channel to the second channel to compensate for an offset associated with the second magnetic field signal.

25. A magnetic field sensor comprising:
a substrate;
a first channel comprising a first magnetic field sensing element supported by the substrate and configured to generate a first magnetic field signal indicative of a first magnetic field experienced by the first magnetic field sensing element, wherein the first channel further comprises a switching circuit coupled to receive the first magnetic field signal and configured to generate a sampled signal, and wherein the switching circuit comprises an analog-to-digital converter configured to convert the first magnetic field signal into a digital signal;
a second channel comprising a second magnetic field sensing element supported by the substrate and configured to generate a second magnetic field signal indicative of a second magnetic field experienced by the second magnetic field sensing element; and
at least one shield configured to reduce a bandwidth of the first magnetic field by a first amount and to reduce a bandwidth of the second magnetic field by a second amount.

26. The magnetic field sensor of claim 25, wherein the first channel is further configured to generate a first sensor output signal based on the first magnetic field signal and the second channel is further configured to generate a second sensor output signal based on the second magnetic field signal.

27. The magnetic field sensor of claim 25, further comprising a processor coupled to receive the first magnetic field signal and the second magnetic field signal and configured to generate a combined sensor output signal based on the first magnetic field signal and the second magnetic field signal.

28. The magnetic field sensor of claim 27, further comprising:
a first signal path configured to carry a low frequency signal extracted from the second magnetic field signal from the second channel to the first channel; and
a second path configured to carry an offset-compensated signal from the first channel to the second channel to compensate for an offset associated with the second magnetic field signal.

29. A magnetic field sensor comprising:
a substrate;
a first channel comprising a first magnetic field sensing element supported by the substrate and configured to generate a first magnetic field signal indicative of a first magnetic field experienced by the first magnetic field sensing element;
a second channel comprising a second magnetic field sensing element supported by the substrate and configured to generate a second magnetic field signal indicative of a second magnetic field experienced by the second magnetic field sensing element; and
at least one shield configured to reduce a bandwidth of the first magnetic field by a first amount and to reduce a bandwidth of the second magnetic field by a second amount; and
a lead frame supporting the substrate, wherein the at least one shield comprises a die attach pad of the lead frame that is disposed under the first magnetic field sensing element and is not disposed under the second magnetic field sensing element.

30. The magnetic field sensor of claim 29, wherein the first channel further comprises a switching circuit coupled to receive the first magnetic field signal and configured to generate a sampled signal.

31. The magnetic field sensor of claim 30, wherein the at least one shield is configured to reduce aliasing of the sampled signal.

32. The magnetic field sensor of claim 30, wherein the switching circuit comprises a chopping circuit configured to chop the first magnetic field sensing element.

33. The magnetic field sensor of claim 30, wherein the switching circuit comprises an analog-to-digital converter configured to convert the first magnetic field signal into a digital signal.

34. The magnetic field sensor of claim 29, wherein the first channel is further configured to generate a first sensor output signal based on the first magnetic field signal and the second channel is further configured to generate a second sensor output signal based on the second magnetic field signal.

35. The magnetic field sensor of claim 29, further comprising a processor coupled to receive the first magnetic field signal and the second magnetic field signal and configured to generate a combined sensor output signal based on the first magnetic field signal and the second magnetic field signal.

36. The magnetic field sensor of claim 35, further comprising:
a first signal path configured to carry a low frequency signal extracted from the second magnetic field signal from the second channel to the first channel; and
a second path configured to carry an offset-compensated signal from the first channel to the second channel to compensate for an offset associated with the second magnetic field signal.

37. A magnetic field sensor comprising:
a substrate;
a first channel comprising a first magnetic field sensing element supported by the substrate and configured to generate a first magnetic field signal indicative of a first magnetic field experienced by the first magnetic field sensing element;
a second channel comprising a second magnetic field sensing element supported by the substrate and configured to generate a second magnetic field signal indicative of a second magnetic field experienced by the second magnetic field sensing element; and
at least one shield configured to reduce a bandwidth of the first magnetic field by a first amount and to reduce a bandwidth of the second magnetic field by a second amount, wherein the at least one shield comprises a conductive layer disposed over the first magnetic field sensing element and not disposed over the second magnetic field sensing element.

38. The magnetic field sensor of claim 37, wherein the first channel further comprises a switching circuit coupled to receive the first magnetic field signal and configured to generate a sampled signal.

39. The magnetic field sensor of claim 38, wherein the at least one shield is configured to reduce aliasing of the sampled signal.

40. The magnetic field sensor of claim 38, wherein the switching circuit comprises a chopping circuit configured to chop the first magnetic field sensing element.

41. The magnetic field sensor of claim 38, wherein the switching circuit comprises an analog-to-digital converter configured to convert the first magnetic field signal into a digital signal.

42. The magnetic field sensor of claim 37, wherein the first channel is further configured to generate a first sensor output signal based on the first magnetic field signal and the second channel is further configured to generate a second sensor output signal based on the second magnetic field signal.

43. The magnetic field sensor of claim 37, further comprising a processor coupled to receive the first magnetic field signal and the second magnetic field signal and configured to generate a combined sensor output signal based on the first magnetic field signal and the second magnetic field signal.

44. The magnetic field sensor of claim 43, further comprising:
  a first signal path configured to carry a low frequency signal extracted from the second magnetic field signal from the second channel to the first channel; and
  a second path configured to carry an offset-compensated signal from the first channel to the second channel to compensate for an offset associated with the second magnetic field signal.

45. The magnetic field sensor of claim 37, wherein the at least one shield is a solid or patterned conductive layer.

46. A method comprising:
  generating a first magnetic field signal indicative of a first magnetic field experienced by a first magnetic field sensing element, the first magnetic field sensing element supported by a substrate;
  generating a second magnetic field signal indicative of a second magnetic field experienced by a second magnetic field sensing element, the second magnetic field sensing element supported by the substrate;
  reducing a bandwidth of the first magnetic field by a first amount using at least one shield;
  reducing a bandwidth of the second magnetic field by a second amount using the at least one shield; and
  generating a sampled signal from the first magnetic field signal and reducing aliasing of the sampled signal.

47. A method comprising:
  generating a first magnetic field signal indicative of a first magnetic field experienced by a first magnetic field sensing element, the first magnetic field sensing element supported by a substrate;
  generating a second magnetic field signal indicative of a second magnetic field experienced by a second magnetic field sensing element, the second magnetic field sensing element supported by the substrate;
  reducing a bandwidth of the first magnetic field by a first amount using at least one shield;
  reducing a bandwidth of the second magnetic field by a second amount using the at least one shield; and
  chopping the first magnetic field sensing element.

* * * * *